(12) United States Patent
Kwon et al.

(10) Patent No.: US 10,886,470 B2
(45) Date of Patent: Jan. 5, 2021

(54) ORGANIC LIGHT EMITTING DISPLAY DEVICE AND OPEN/SHORT TEST METHOD THEREOF

(71) Applicant: Samsung Display Co. Ltd., Yongin-si (KR)

(72) Inventors: Hyuk Soon Kwon, Asan-si (KR); Chun Gi You, Asan-si (KR); Sun Park, Suwon-si (KR); Jong Moo Huh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 31 days.

(21) Appl. No.: 15/483,879

(22) Filed: Apr. 10, 2017

(65) Prior Publication Data

US 2018/0097180 A1 Apr. 5, 2018

(30) Foreign Application Priority Data

Sep. 30, 2016 (KR) .................. 10-2016-0126421

(51) Int. Cl.
*H01L 27/32* (2006.01)
*H01L 51/00* (2006.01)

(52) U.S. Cl.
CPC ...... *H01L 51/0031* (2013.01); *H01L 27/3248* (2013.01); *H01L 27/3276* (2013.01)

(58) Field of Classification Search
CPC ............. H01L 27/3248; H01L 27/3276; H01L 27/3258; H01L 2227/32; H01L 51/0031; H01L 27/1251; H01L 27/3251; H01L 27/3274; G01R 31/025; G01R 31/2635
See application file for complete search history.

(56) References Cited

U.S. PATENT DOCUMENTS

| 9,129,864 | B2 | 9/2015 | Matsuura | |
|---|---|---|---|---|
| 2005/0029937 | A1* | 2/2005 | Kim | H01L 27/3276 313/506 |
| 2006/0001792 | A1* | 1/2006 | Choi | G02F 1/13458 349/54 |
| 2006/0044232 | A1* | 3/2006 | Choi | H01L 27/3244 345/76 |
| 2006/0091399 | A1* | 5/2006 | Lee | H01L 27/12 257/72 |
| 2006/0169981 | A1* | 8/2006 | Joo | G09G 3/3233 257/66 |
| 2007/0120126 | A1* | 5/2007 | Sung | H01L 27/3244 257/59 |
| 2007/0120473 | A1* | 5/2007 | Nakamura | H01L 27/3279 313/506 |
| 2008/0217624 | A1* | 9/2008 | Kwak | G09G 3/3233 257/71 |

(Continued)

FOREIGN PATENT DOCUMENTS

KR 1020060019099 3/2006

*Primary Examiner* — Bitew A Dinke
(74) *Attorney, Agent, or Firm* — Cantor Colburn LLP

(57) ABSTRACT

An organic light emitting display device includes a substrate, a semiconductor pattern disposed on the substrate, a conductive line disposed in a different layer from the semiconductor pattern, a pixel electrode disposed on the conductive line and on the semiconductor pattern, and a connection electrode disposed in a same layer as the pixel electrode. The connection electrode may be connected to the semiconductor pattern and the conductive line.

13 Claims, 17 Drawing Sheets

(56) References Cited

U.S. PATENT DOCUMENTS

| | | | | |
|---|---|---|---|---|
| 2009/0121982 A1* | 5/2009 | Choi | H01L 27/3262 | 345/76 |
| 2011/0175097 A1* | 7/2011 | Song | H01L 27/326 | 257/59 |
| 2011/0303918 A1* | 12/2011 | Im | H01L 27/1225 | 257/59 |
| 2012/0043546 A1* | 2/2012 | Oh | H01L 27/1255 | 257/59 |
| 2012/0146033 A1* | 6/2012 | Lee | H01L 27/124 | 257/59 |
| 2013/0126882 A1* | 5/2013 | You | H01L 51/5206 | 257/71 |
| 2014/0103317 A1* | 4/2014 | Choi | H01L 27/1225 | 257/40 |
| 2014/0111404 A1* | 4/2014 | Omata | H05B 33/08 | 345/76 |
| 2014/0183479 A1* | 7/2014 | Park | H01L 51/56 | 257/40 |
| 2015/0034913 A1* | 2/2015 | Yoon | H01L 51/5203 | 257/40 |
| 2015/0055051 A1* | 2/2015 | Osawa | H01L 27/1225 | 349/48 |
| 2015/0069341 A1* | 3/2015 | Kim | H01L 27/3267 | 257/40 |
| 2015/0144891 A1* | 5/2015 | Park | H01L 27/3246 | 257/40 |
| 2015/0243705 A1* | 8/2015 | Kim | H01L 27/3258 | 257/88 |
| 2015/0287771 A1* | 10/2015 | Lee | H01L 27/3276 | 257/40 |
| 2015/0364530 A1* | 12/2015 | Yoon | H01L 27/326 | 257/40 |
| 2016/0043349 A1* | 2/2016 | Park | H01L 51/5271 | 257/40 |
| 2016/0064673 A1* | 3/2016 | Park | H01L 27/3276 | 257/40 |
| 2016/0190224 A1* | 6/2016 | Kim | H01L 27/124 | 257/40 |
| 2017/0125497 A1* | 5/2017 | Kim | H01L 27/3248 | |
| 2017/0338293 A1* | 11/2017 | Guo | H01L 27/3267 | |
| 2017/0338295 A1* | 11/2017 | Lee | G09G 3/3225 | |

* cited by examiner

ORGANIC LIGHT EMITTING DISPLAY DEVICE AND OPEN/SHORT TEST METHOD THEREOF

This application claims priority to Korean Patent Application No. 10-2016-0126421, filed on Sep. 30, 2016, and all the benefits accruing therefrom under 35 U.S.C. 119, the content of which in its entirety is herein incorporated by reference.

BACKGROUND

1. Field

Exemplary embodiments of the invention relate to an organic light emitting display device and an open/short test method thereof.

2. Description of the Related Art

Display devices are becoming increasingly important along with the development of multimedia. Accordingly, various types of display devices such as a liquid crystal display ("LCD"), an organic light emitting display ("OLED") and the like are used.

Among the various types of the display devices, an OLED device displays an image using an organic light emitting diode that emits light by recombination of electrons and holes. The OLED device is advantageous in that it has a high response speed, a high luminance and a wide viewing angle, and is driven at low power consumption.

The OLED device generally includes unit pixel portions, each consisting of three (e.g., red, green and blue) sub-pixel portions. Each sub-pixel portion is independently driven by a driving element in which a plurality of thin film transistors and various metal lines are arranged.

SUMMARY

Exemplary embodiments of the invention provide an organic light emitting display ("OLED") device with improved accuracy in an open/short test and an open/short test method thereof.

The OLED device according to an exemplary embodiment of the invention improves the accuracy in an open/short test.

According to an exemplary embodiment of the invention discloses an OLED device including a substrate, a semiconductor pattern disposed on the substrate, a conductive line disposed in a different layer from the semiconductor pattern, a pixel electrode disposed on the conductive line and on the semiconductor pattern, and a connection electrode disposed in a same layer as the pixel electrode. The connection electrode may be connected to the semiconductor pattern and the conductive line.

According to an exemplary embodiment of the invention also discloses an OLED device including a substrate, a first semiconductor pattern disposed on the substrate, a data line disposed on the first semiconductor pattern, a pixel electrode disposed on the data line, and a first connection electrode in contact with the first semiconductor pattern and the data line. The first connection electrode may be disposed in a same layer as the pixel electrode.

According to an exemplary embodiment of the invention also discloses an open/short test method of an OLED device, the method including forming a semiconductor pattern on a substrate, forming a conductive line on the semiconductor pattern, providing a first test signal to one end of the conductive line, and detecting a second test signal at the other end opposite to one end of the conductive line, and comparing the first and second test signals.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
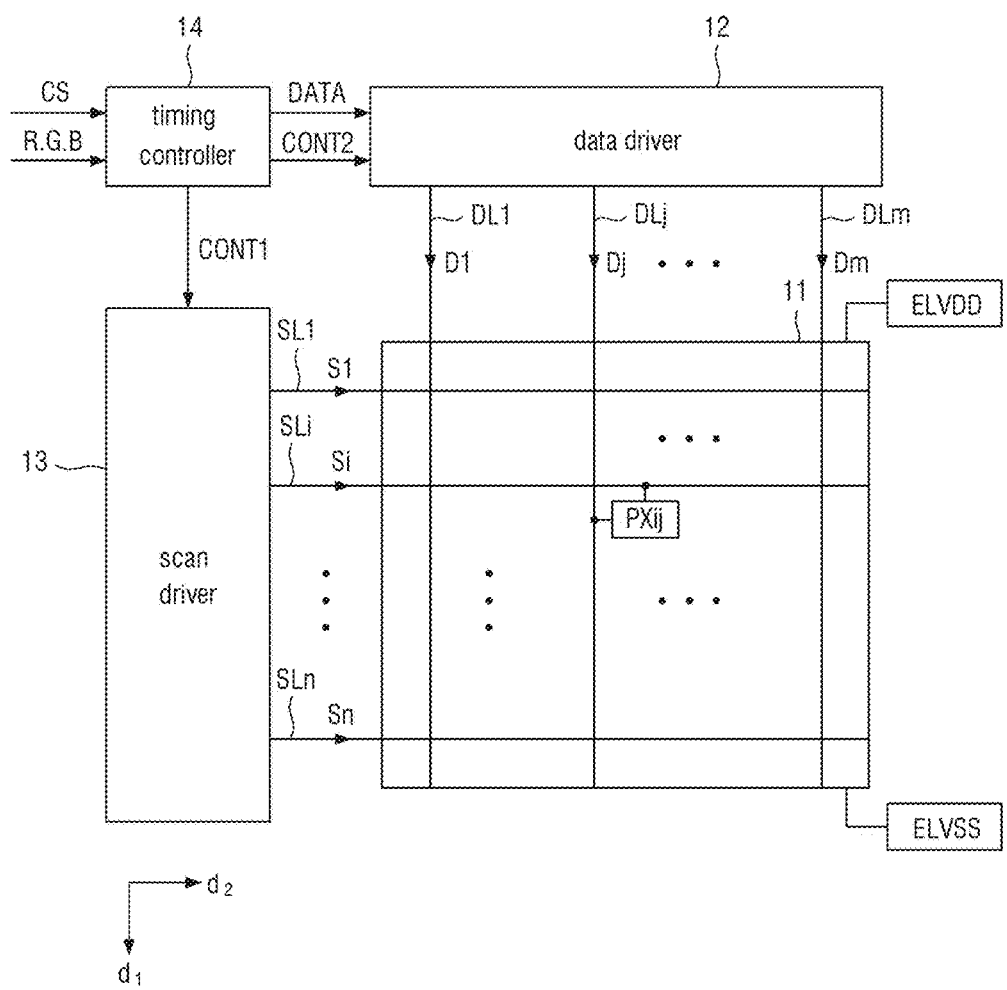
FIG. 1 is a block diagram schematically illustrating an exemplary embodiment of an organic light emitting display ("OLED") device according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein. Hereinafter, preferred exemplary embodiments of the invention will be described in detail with reference to the attached drawings.

FIG. 1 is a block diagram schematically illustrating an organic light emitting display ("OLED") device according to an exemplary embodiment of the invention.

The OLED device according to an exemplary embodiment of the invention may include a display panel 11, a data driver 12, a scan driver 13, and a timing controller 14.

The display panel 11 is an area for displaying an image. The display panel 11 may be connected to the scan driver 13 through first to n-th scan lines SL1 to SLn (n is a natural number equal to or greater than 2). Further, the display panel 11 may be connected to the data driver 12 through first to m-th data lines DL1 to DLm (m is a natural number equal to or greater than 2). The display panel 11 may include a plurality of pixel portions including a pixel portion PXij. In one exemplary embodiment, the plurality of pixel portions may be electrically connected to one of the first to n-th scan lines SL1 to SLn and one of the first to m-th data lines DL1 to DLm, respectively.

The first to m-th data lines DL1 to DLm may extend along a first direction d1. The first to n-th scan lines SL1 to SLn may extend along a second direction d2. In an exemplary embodiment, the first direction d1 may intersect the second direction d2, for example. In FIG. 1, the first direction d1 is illustrated as a column direction, and the second direction d2 is illustrated as a row direction, for example. The plurality of pixel portions may be arranged on one substrate to be insulated from each other, and may be arranged, for example, in a matrix form.

The scan driver 13 may receive a first control signal CONT1 from the timing controller 14. The scan driver 13 may provide first to n-th scan signals 51 to Sn to the display panel 11 according to the first control signal CONT1.

In an exemplary embodiment, the data driver 12 may include, for example, a shift register, a latch, and a digital-to-analog converter ("DAC"). The data driver 12 may receive a second control signal CONT2 and image data DATA from the timing controller 14. The data driver 12 may select a reference voltage corresponding to the second control signal CONT2 and convert the image data DATA of a digital waveform inputted according to the selected reference voltage into first to m-th data signals D1 to Dm. The data driver 12 may provide the generated data signals D1 to Dm to the display panel 11.

The timing controller 14 may receive an image signal R.G.B and a control signal CS from the outside. The control signal CS may include, for example, a vertical synchronization signal, a horizontal synchronization signal, a main clock signal, and a data enable signal. The timing controller 14 may process the signals provided from the outside in accordance with the operation conditions of the display panel 11, and then generate the image data DATA, the first control signal CONT1 and the second control signal CONT2.

The first control signal CONT1 may include a scan start signal for instructing the start of outputting the first to n-th scan signals 51 to Sn, a gate clock signal for controlling the output timing of a scan-on pulse, and the like. The second control signal CONT2 may include a horizontal synchronization start signal for instructing the start of inputting the image data DATA, a load signal for controlling the application of the first to m-th data signals D1 to Dm to the first to m-th data lines DL1 to DLm, and the like.

Although not shown in the drawing, the organic light emitting diode display according to an exemplary embodiment of the invention may further include a power supply unit. The power supply unit may provide a first driving voltage ELVDD and a second driving voltage ELVSS to the plurality of pixel portions according to the control signal supplied from the timing controller 14.

Figure 2:
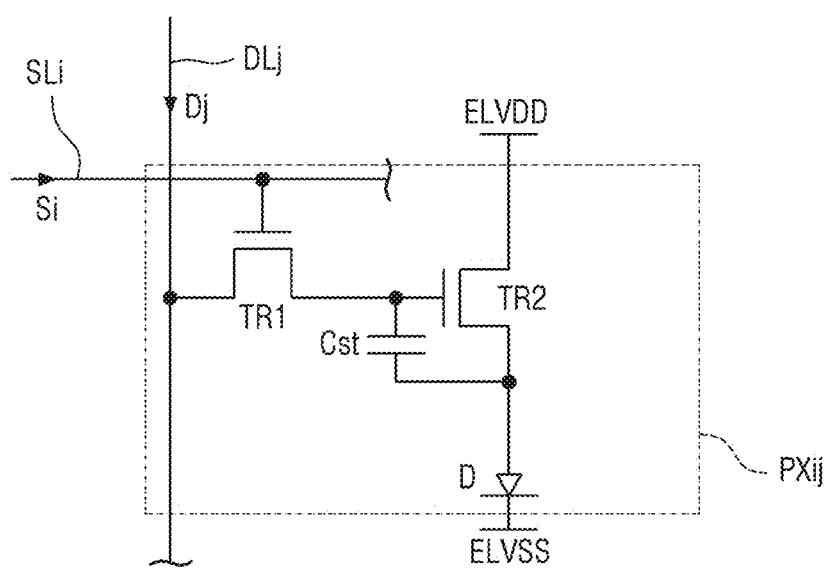
FIG. 2 is an equivalent circuit diagram showing an exemplary embodiment of the pixel portion shown in FIG. 1.
Figure 2:
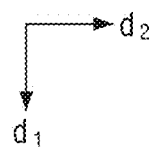

FIG. 2 is an equivalent circuit diagram showing an exemplary embodiment of the pixel portion shown in FIG. 1. The pixel portion PXij electrically connected to a j-th data line DLj and an i-th scan line SLi will be described with reference to FIGS. 1 and 2.

The pixel portion PXij may be electrically connected to the j-th data line DLj extending in the first direction d1 and the i-th scan line SLi extending in the second direction d2.

The pixel portion PXij may include a first switching element TR1, a second switching element TR2, an organic light emitting diode D, and a storage capacitor Cst. In an exemplary embodiment, each of the first switching element TR1 and the second switching element TR2 may be a three-terminal element such as a thin film transistor ("TFT"). In one exemplary embodiment, the first switching element TR1 and the second switching element TR2 may be NMOS type TFTs, for example. Hereinafter, a case where the first switching element TR1 and the second switching element TR2 are NMOS type TFTs will be described as an example.

The first switching element TR1 may be electrically connected to the j-th data line DLj (j is a natural number equal to or greater than 1 and equal to or less than m), the i-th scan line SLi (i is a natural number equal to or greater than 1 and equal to or less than n) and the second switching element TR2. More specifically, the first switching element TR1 may include a control electrode electrically connected to the i-th scan line SLi, one electrode electrically connected to the j-th data line DLj and the other electrode electrically connected to a control electrode of the second switching element TR2.

The second switching element TR2 may include a control electrode electrically connected to the other electrode of the first switching element TR1, one electrode electrically connected to a driving voltage line provided with the first driving voltage ELVDD and the other electrode electrically connected to the organic light emitting diode D.

One electrode of the storage capacitor Cst may be electrically connected to the other electrode of the first switching element TR1, and the other electrode of the storage capacitor Cst may be electrically connected to the organic light emitting diode D.

The first switching element TR1 may be turned on according to an i-th scan signal Si supplied from the i-th scan line SLi to provide a j-th data signal Dj supplied from the j-th data line DLj to the storage capacitor Cst. The storage capacitor Cst may charge a voltage difference between the provided j-th data signal Dj and one electrode of the organic light emitting diode D.

The second switching element TR2 may control the amount of the driving current supplied from a first driving voltage terminal (not shown), to which the first driving voltage ELVDD is provided, to a second driving voltage terminal (not shown), to which the second driving voltage ELVSS is provided, through the organic light emitting diode D according to the voltage charged in the storage capacitor Cst. That is, the first switching element TR1 may be a switching transistor, and the second switching element TR2 may be a driving transistor.

Figure 3:
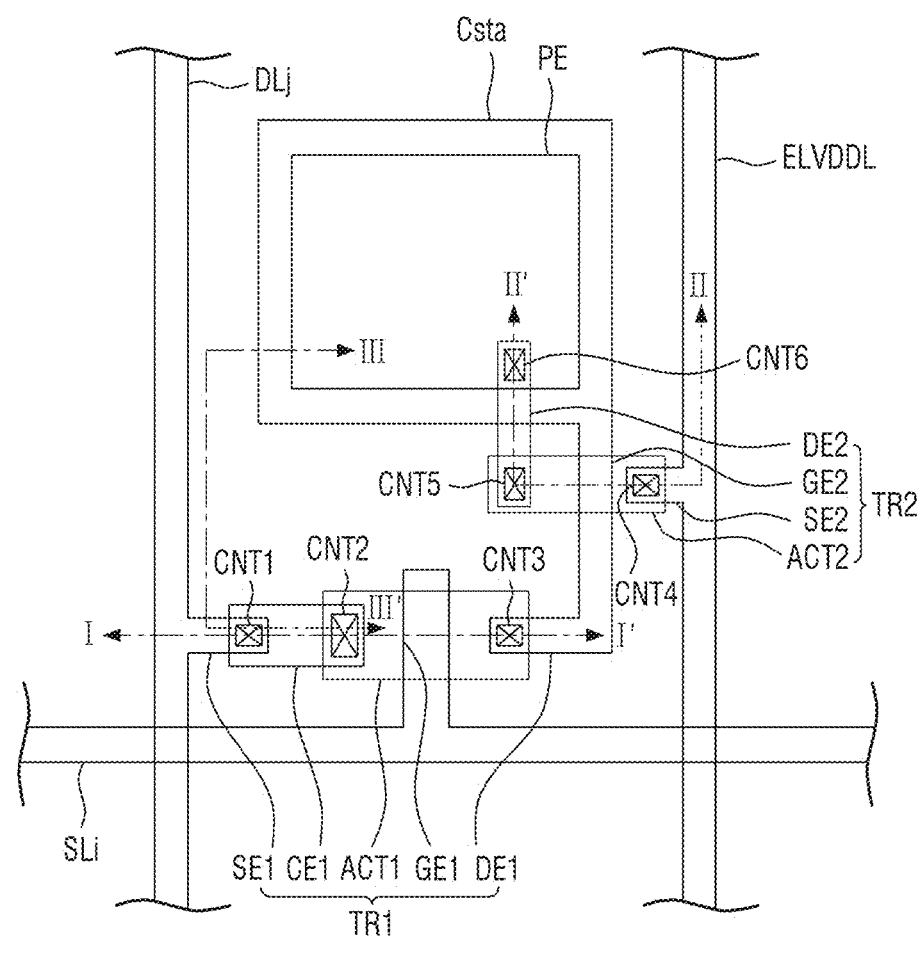
FIG. 3 is a plan view schematically illustrating an exemplary embodiment of the pixel portion of the OLED device according to the invention.
Figure 3:
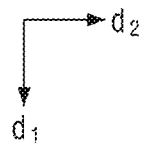
Figure 4:
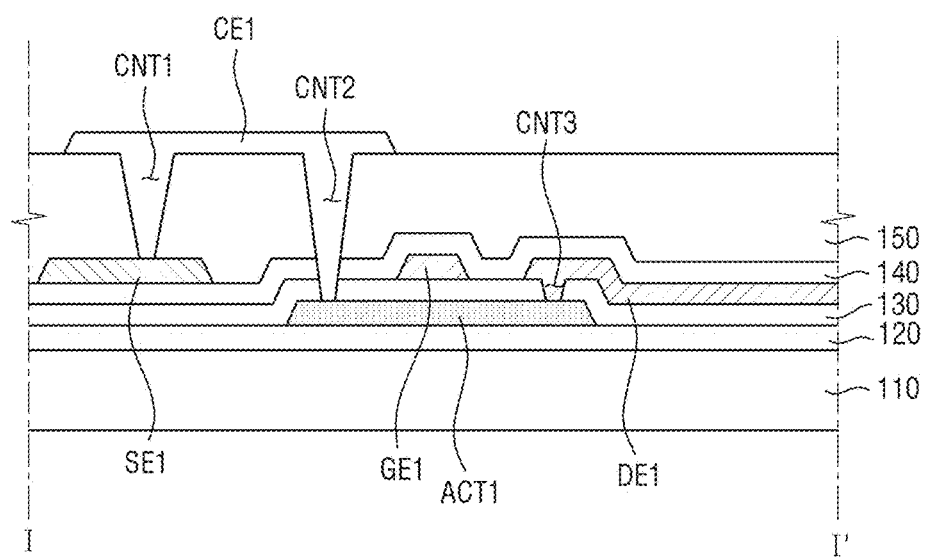
FIG. 4 is a cross-sectional view taken along line I-I' shown in FIG. 3.
Figure 5:
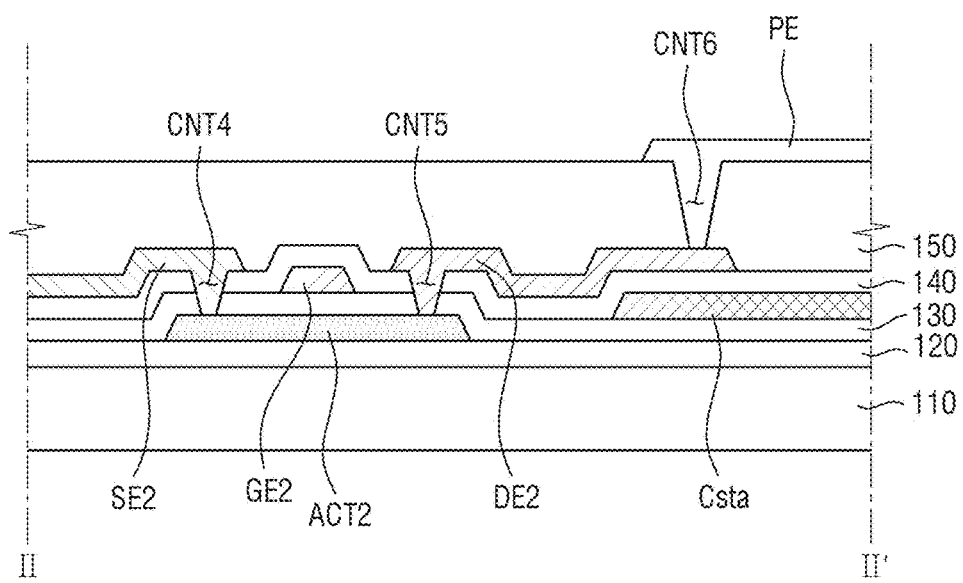
FIG. 5 is a cross-sectional view taken along line II-IP shown in FIG. 3.
Figure 6:
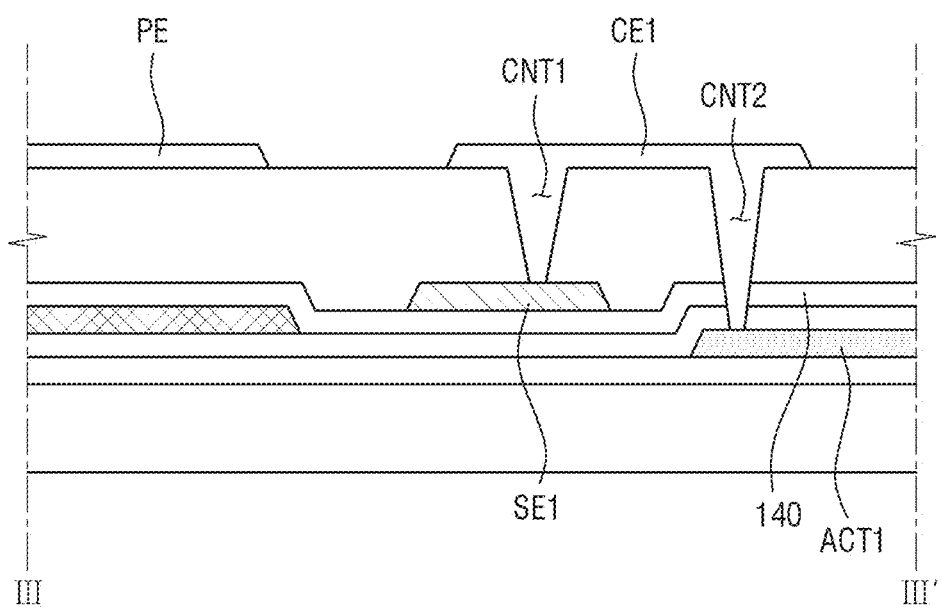
FIG. 6 is a cross-sectional view taken along line shown in FIG. 3.

FIG. 3 is a plan view schematically illustrating the pixel portion of the OLED device according to an exemplary embodiment of the invention. FIG. 4 is a cross-sectional view taken along line I-I' shown in FIG. 3. FIG. 5 is a cross-sectional view taken along line II-II' shown in FIG. 3. FIG. 6 is a cross-sectional view taken along line shown in FIG. 3.

Referring to FIGS. 3 to 6, a substrate 110 may be, for example, an insulating substrate. In an exemplary embodiment, the substrate 110 may include a glass substrate, a quartz substrate, a ceramic substrate, or a plastic substrate. The substrate 110 may be a flexible substrate that may be bent, folded, or rolled in another exemplary embodiment. In this case, the substrate 110 may include polyimide, but is not limited thereto.

A buffer layer 120 may be disposed on the substrate 110. The buffer layer 120 may prevent the penetration of impurity elements and flatten the surface of the substrate 110. In an exemplary embodiment, the buffer layer 120 may include, for example, one of a silicon nitride (SiNx) layer, a silicon oxide (SiO2) layer, and a silicon oxynitride (SiOxNy) layer. The buffer layer 120 may be omitted depending on types of the substrate 110, process conditions, and the like.

A semiconductor layer including a first semiconductor pattern ACT1 and a second semiconductor pattern ACT2 may be disposed on the buffer layer 120. The first semiconductor pattern ACT1 may form the first switching element TR1 together with a first source electrode SE1, a first drain electrode DE1 and a first gate electrode GE1. The first semiconductor pattern ACT1 includes a region where a channel of the first switching element TR1 is provided. The second semiconductor pattern ACT2 may form the second switching element TR2 together with a second source electrode SE2, a second drain electrode DE2 and a second gate electrode GE2. The second semiconductor pattern ACT2 includes a region where a channel of the second switching element TR2 is provided.

In an exemplary embodiment, the first semiconductor pattern ACT1 and the second semiconductor pattern ACT2 may include at least one of amorphous silicon, polycrystalline silicon, single crystalline silicon and low-temperature polycrystalline silicon, or a combination of at least two of the above-mentioned substances, for example. The first semiconductor pattern ACT1 and the second semiconductor pattern ACT2 may include an oxide semiconductor in another exemplary embodiment.

A first insulating layer 130 may be disposed on the first semiconductor pattern ACT1 and the second semiconductor pattern ACT2. The first insulating layer 130 may be, for example, a gate insulating layer. In an exemplary embodiment, the first insulating layer 130 may include at least one of an inorganic insulating material such as silicon oxide (SiOx) and silicon nitride (SiNx) and an organic insulating material such as benzocyclobutene ("BCB"), an acrylic material and polyimide, or a combination of one or more of the above-mentioned materials.

A gate conductor including the i-th scan line SLi, the first gate electrode GE1, the second gate electrode GE2, the first drain electrode DE1 and one electrode Csta of the storage capacitor Cst may be disposed on the first insulating layer 130.

The first gate electrode GE1 may be electrically connected to the i-th scan line SLi and protrude from the i-th scan line SLi toward the first semiconductor pattern ACT1. Accordingly, the first gate electrode GE1 may overlap, at least partially, the first semiconductor pattern ACT1.

The second gate electrode GE2 may extend from the first drain electrode DE1. One electrode Csta of the storage capacitor Cst may extend from the first drain electrode DE1. That is, the first drain electrode DE1, the second gate electrode GE2 and one electrode Csta of the storage capacitor Cst may be electrically connected to each other, and may be unitary with one another by the same mask process in one exemplary embodiment.

The first drain electrode DE1 may overlap, at least partially, the first semiconductor pattern ACT1. The second gate electrode GE2 may overlap, at least partially, the second semiconductor pattern ACT2. One electrode Csta of the storage capacitor Cst may overlap, at least partially, a pixel electrode PE to be described later. The pixel electrode PE is one electrode of the organic light emitting diode D (refer to FIG. 2), and may be, for example, an anode electrode.

In an exemplary embodiment, the gate conductor may include at least one of aluminum-based metal including an aluminum (Al) alloy, a silver-based metal including a silver (Ag) alloy, copper-based metal including a copper (Cu) alloy, molybdenum-based metal including a molybdenum (Mo) alloy, chromium (Cr), titanium (Ti), and tantalum (Ta), for example.

A second insulating layer 140 may be disposed on the gate conductor. The second insulating layer 140 may be, for example, a gate insulating layer. In an exemplary embodiment, the first insulating layer 130 may include at least of an inorganic insulating material such as silicon oxide (SiOx) and silicon nitride (SiNx) and an organic insulating material such as benzocyclobutene ("BCB"), an acrylic material and polyimide, or a combination of one or more of the above-mentioned materials, for example.

A data conductor including the j-th data line DLj, a driving voltage line ELVDDL, the first source electrode SE1, the second source electrode SE2 and the second drain electrode DE2 may be disposed on the second insulating layer 140. The j-th data line DLj, the driving voltage line ELVDDL, the first source electrode SE1, the second source electrode SE2 and the second drain electrode DE2 may be arranged in the same layer.

The first source electrode SE1 may be disposed in a different layer from the first drain electrode DE1. One end of the first source electrode SE1 may be electrically connected to the j-th data line DLj, and the other end of the first source electrode SE1 may be electrically connected to the first semiconductor pattern ACT1 through a first connection electrode CE1 to be described later. In an exemplary embodiment as illustrated in FIGS. 3 and 4, FIG. 4 the drain electrode DE1 and gate electrode GE1 are directly covered by a same layer, i.e., second insulating layer 140. FIGS. 3 and 4 illustrate a data line DLj and source electrode SE1 extending therefrom disposed in a different layer from the first semiconductor pattern ACT1.

The second source electrode SE2 may be electrically connected to the driving voltage line ELVDDL. The second drain electrode DE2 may be electrically connected to the pixel electrode PE through a sixth contact hole CNT6. The second source electrode SE2 and the second drain electrode DE2 may be spaced apart from each other on the second insulating layer 140. The second source electrode SE2 and the second drain electrode DE2 may overlap the second semiconductor pattern ACT2 and may be electrically connected to the second semiconductor pattern ACT2 through a fourth contact hole CNT4 and a fifth contact hole CNT5, respectively.

In an exemplary embodiment, the data conductor may include at least one of metal, an alloy, metal nitride, conductive metal oxide, and a transparent conductive material. In an exemplary embodiment, the data conductor may have, for example, a single-layer or multi-layer structure including nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) or tantalum (Ta). Further, an alloy provided by incorporating at least one element of titanium (Ti), zirconium (Zr), tungsten (W), tantalum (Ta), niobium (Nb), platinum (Pt), hafnium (Hf), oxygen (O) and nitrogen (N) in the metal may be used as a material of the data conductor, for example.

A planarization layer 150 may be disposed on the data conductor. The planarization layer 150 may include an organic material in one exemplary embodiment. In an exemplary embodiment, the planarization layer 150 may include at least one of polyimide, polyacryl and polysiloxane, for example.

The pixel electrode PE and the first connection electrode CE1 may be disposed on the planarization layer 150. More specifically, the pixel electrode PE and the first connection electrode CE1 may be disposed in the same layer. That is, the pixel electrode PE and the first connection electrode CE1 may be simultaneously provided by the same mask process.

The pixel electrode PE may be electrically connected to the second drain electrode DE2 exposed by the sixth contact hole CNT6. That is, the pixel electrode PE may be an anode which is a hole injection electrode, for example.

The first connection electrode CE1 is connected to each of the first source electrode SE1 and the first semiconductor pattern ACT1. More specifically, the first connection electrode CE1 is connected to at least a part of the first source electrode SE1 exposed through the first contact hole CNT1. Also, the first connection electrode CE1 is connected to at least a part of the first semiconductor pattern ACT1 exposed through the second contact hole CNT2. That is, the first source electrode SE1 and the first semiconductor pattern ACT1 may be indirectly connected to each other through the first connection electrode CE1.

In an exemplary embodiment, the pixel electrode PE and the first connection electrode CE1 may include, for example, a transparent conductive material such as indium tin oxide ("ITO") and indium zinc oxide ("IZO") or reflective metal such as aluminum, silver, chromium, or an alloy thereof.

Therefore, the first source electrode SE1 of the first switching element TR1 may provide the signal supplied from the j-th data line DLj to the first semiconductor pattern ACT1 through the first connection electrode CE1. The signal provided to the first semiconductor pattern ACT1 may be provided to each of the second gate electrode GE2 of the second switching element TR2 and one electrode Csta of the storage capacitor Cst through the first drain electrode DE1.

Although not shown in the drawing, in another exemplary embodiment, a pixel defining layer may be disposed on the pixel electrode PE and the first connection electrode CE1. The pixel defining layer exposes a part of the pixel electrode PE. In an exemplary embodiment, the pixel defining layer may include resin such as polyacrylic resin and polyimide resin. In addition, an organic light emitting layer (not shown) may be disposed on the pixel electrode PE exposed by the pixel defining layer, and a common electrode may be disposed on the organic light emitting layer. The pixel electrode PE, the organic light emitting layer and the common electrode may form the organic light emitting diode D.

Figure 7:
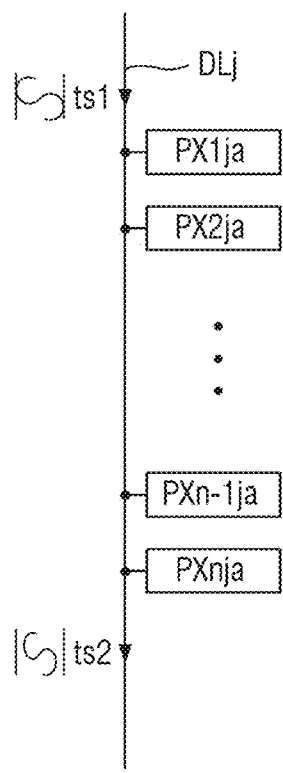
FIG. 7 is a diagram explaining an exemplary embodiment of an open/short test method of the OLED device according to the invention.
Figure 8:
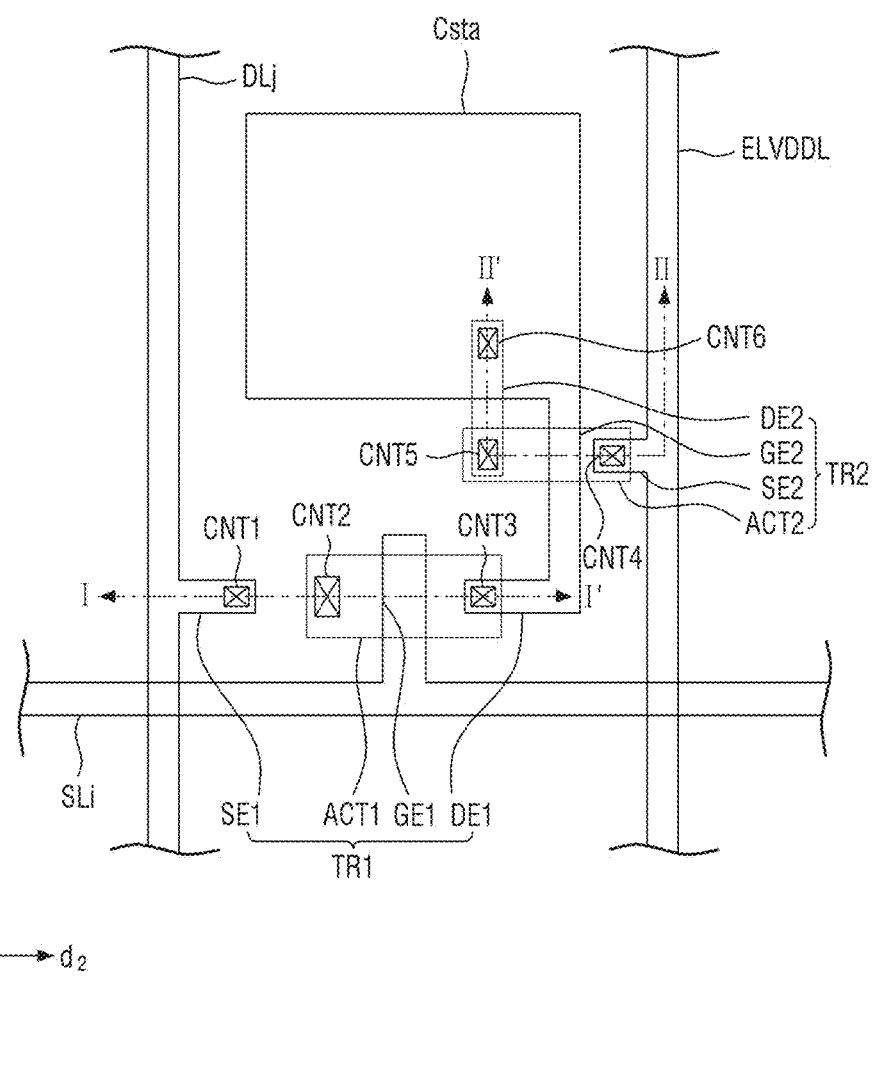
FIG. 8 is a plan view schematically showing an example of the pixel portion during the open/short test shown in FIG. 7.
Figure 9:
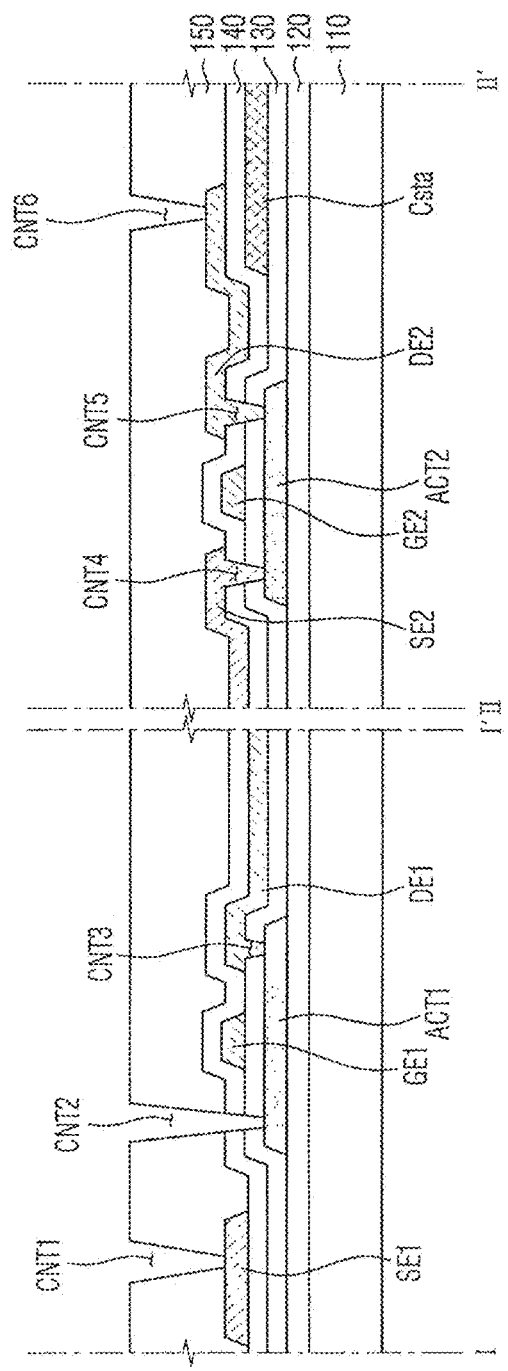
FIG. 9 is a cross-sectional view taken along line I-I' and line II-II' shown in FIG. 8.

FIG. 7 is a diagram explaining an open/short test method of the OLED device according to an exemplary embodiment of the invention. FIG. 8 is a plan view schematically showing an example of the pixel portion during the open/short test shown in FIG. 7. FIG. 9 is a cross-sectional view taken along line I-I' and line II-II' shown in FIG. 8. A redundant description similar to the description of FIGS. 1 to 6 will be omitted. In connection with FIG. 7, the j-th data line DLj and first to n-th pixel portions PX1ja to PXnja electrically connected to the j-th data line DLj will be described as an example. In this case, the first to n-th pixel portions PX1ja to PXnja are electrically connected to different scan lines, respectively.

Referring to FIG. 7, a first test signal ts1 is defined as a signal provided to one end (e.g., an upper end in FIG. 7) of the j-th data line DLj. In this case, one end of the j-th data line DLj is defined as a region relatively close to the first pixel portion PX1ja. A second test signal ts2 is defined as a signal obtained when the first test signal ts1 provided to one end of the j-th data line DLj is detected at the other end (e.g., a lower end in FIG. 7) of the j-th data line DLj via the j-th data line DLj. That is, the open/short test of the j-th data line DLj may be performed by comparing the waveform difference between the first test signal ts1 and the second test signal ts2.

However, referring to FIGS. 8 and 9, in the OLED device according to an exemplary embodiment of the invention, an open/short test is performed in a state where the pixel electrode PE and the first connection electrode CE1 (refer to FIGS. 3 and 6) are not provided. That is, since the pixel electrode PE and the first connection electrode CE1 are provided relatively later than the other components, the open/short test of the j-th data line DLj is performed in a state where the pixel electrode PE and the first connection electrode CE1 are not provided.

Therefore, since the display device is in a state where the j-th data line DLj and the first semiconductor pattern ACT1 are not connected to each other, an influence of the first semiconductor pattern ACT1 and other components (e.g., the first drain electrode DE1, one electrode Csta of the storage capacitor Cst and the like) electrically connected to the first semiconductor pattern ACT1 may be excluded during the open/short test of the j-th data line DLj. Accordingly, in the OLED device according to an exemplary embodiment of the invention, it is possible to obtain more accurate results in the open/short test.

In FIGS. 8 and 9, it is illustrated that the open/short test is performed in a state where the planarization layer 150, the first contact hole CNT1, the second contact hole CNT2 and the sixth contact hole CNT6 are provided, but the invention is not limited thereto. That is, when the first semiconductor pattern ACT1 and the j-th data line DLj are electrically insulated during the open/short test of the j-th data line DLj, the open/short test may be performed in a state where the planarization layer 150 is not provided.

Figure 10A:
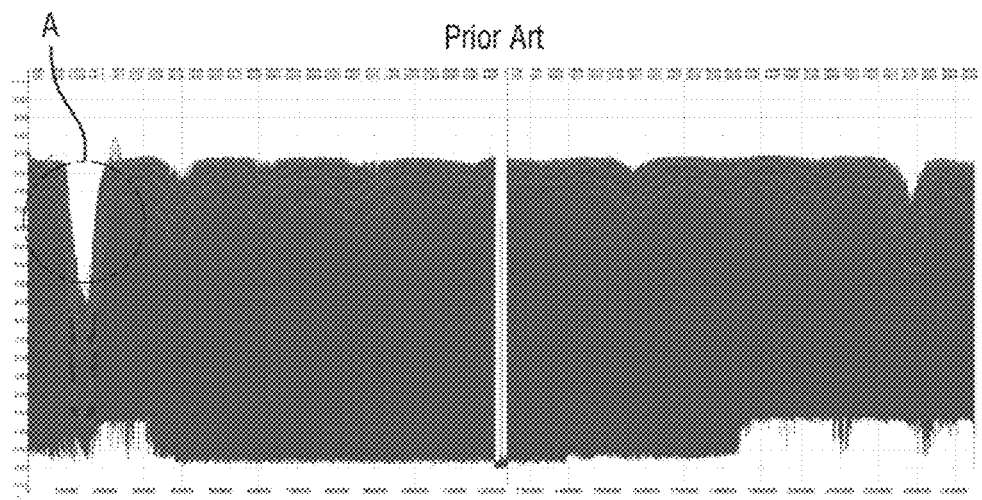
FIGS. 10A and 10B are diagrams explaining results of the open/short test of a comparative example of an OLED device and an exemplary embodiment of the OLED device according to the invention, respectively.
Figure 10B:
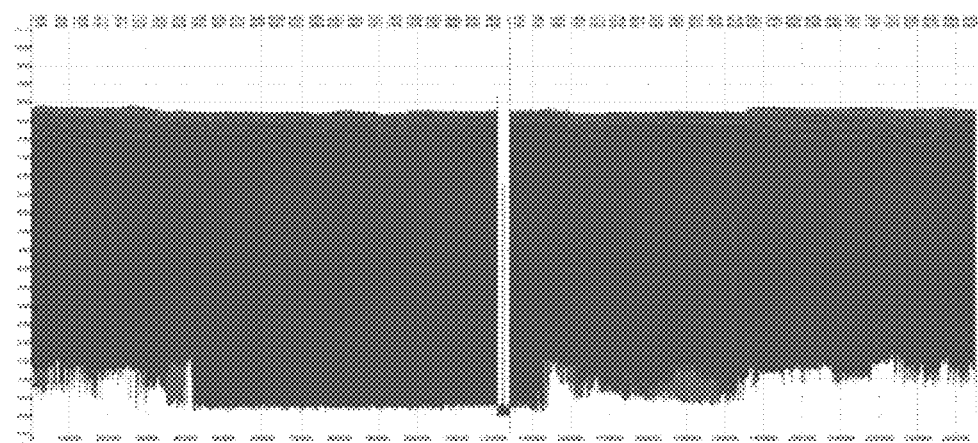

FIGS. 10A and 10B are diagrams explaining results of the open/short test of an OLED device according to a comparative example and the OLED device according to an exemplary embodiment of the invention, respectively. FIG. 10A shows the results of the open/short test of an OLED device according to a comparative example, and FIG. 10B shows the results of the open/short test of the OLED device according to an exemplary embodiment of the invention. Here, FIG. 10A shows a case where the semiconductor pattern of the switching element electrically connected to the i-th scan line is connected directly to the j-th data line.

Referring to FIG. 10A, it is seen that noise is generated in region A. That is, in the OLED device according to the comparative example, since the j-th data line is connected directly to the semiconductor pattern of the switching element electrically connected to the i-th scan line, an influence of components other than the j-th data line is generated during the open/short test. Accordingly, the accuracy of the open/short test results is reduced.

Referring to FIG. 10B, noise may not be generated unlike FIG. 10A. That is, since the OLED device according to the exemplary embodiment of the invention is in a state where the j-th data line DLj and the first semiconductor pattern ACT1 are electrically insulated, an influence of components other than the j-th data line DLj may be excluded during the open/short test. Accordingly, the OLED device according to the exemplary embodiment of the invention has a higher accuracy of the open/short test results than the OLED device according to the comparative example.

Figure 11:
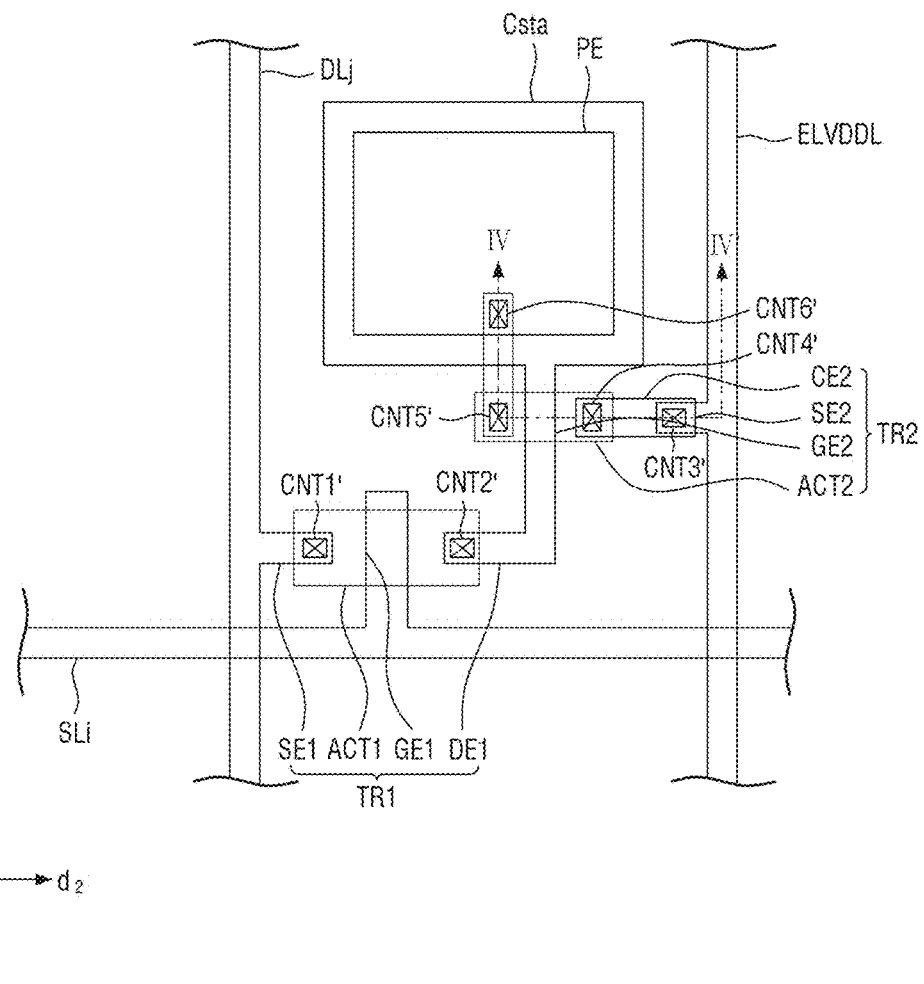
FIG. 11 is a plan view schematically illustrating another exemplary embodiment of a pixel portion of an OLED device according to the invention.
Figure 12:
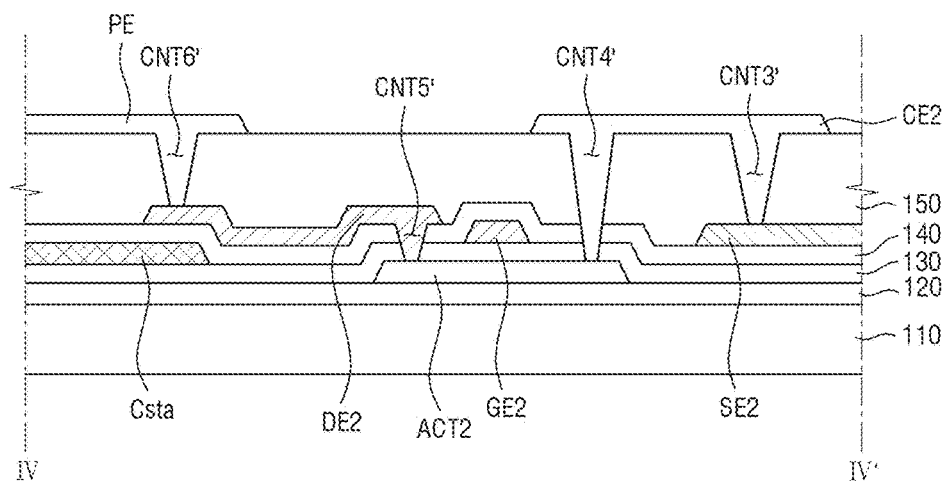
FIG. 12 is a cross-sectional view taken along line IV-IV' shown in FIG. 11.

FIG. 11 is a plan view schematically illustrating a pixel portion of an OLED device according to another exemplary embodiment of the invention. FIG. 12 is a cross-sectional view taken along line IV-IV' shown in FIG. 11. In connection with FIGS. 11 and 12, a redundant description similar to the description of FIGS. 1 to 10 will be omitted. For simplicity of description, the first to sixth contact holes are denoted by CNT1' to CNT6', and other components are designated by the same reference numerals as those used in FIGS. 1 to 10.

Referring to FIGS. 11 and 12, the first source electrode SE1 of the first switching element TR1 is connected directly to the first semiconductor pattern ACT1 through a first contact hole CNT1'. Accordingly, the data signal provided from the j-th data line DLj to the first source electrode SE1 of the first switching element TR1 may be provided directly to the first semiconductor pattern ACT1.

The second source electrode SE2 of the second switching element TR2 electrically connected to the driving voltage line ELVDDL is electrically connected to the second semiconductor pattern ACT2 through the second connecting electrode CE2. More specifically, the second source electrode SE2 of the second switching element TR2 is electrically connected to the second connection electrode CE2 through the third contact hole CNT3'. Further, the second semiconductor pattern ACT2 is electrically connected to second connecting electrode CE2 through the fourth contact hole CNT4'. Accordingly, the first driving voltage ELVDD supplied from the driving voltage line ELVDDL to the second source electrode SE2 of the second switching element TR2 may be provided to the second semiconductor pattern ACT2 through the second connection electrode CE2.

The second connection electrode CE2 may be disposed on the planarization layer 150. More specifically, the second connection electrode CE2 may be disposed in the same layer as the pixel electrode PE. In an exemplary embodiment, the second connection electrode CE2 may include, for example, a transparent conductive material such as ITO and IZO or reflective metal such as aluminum, silver, chromium, or an alloy thereof.

Figure 13:
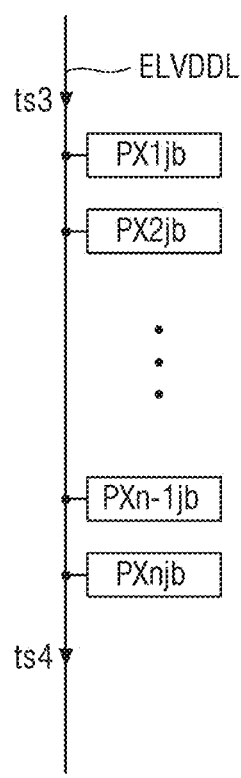
FIG. 13 is a diagram explaining another exemplary embodiment of an open/short test method of the OLED device according to the invention.
Figure 14:
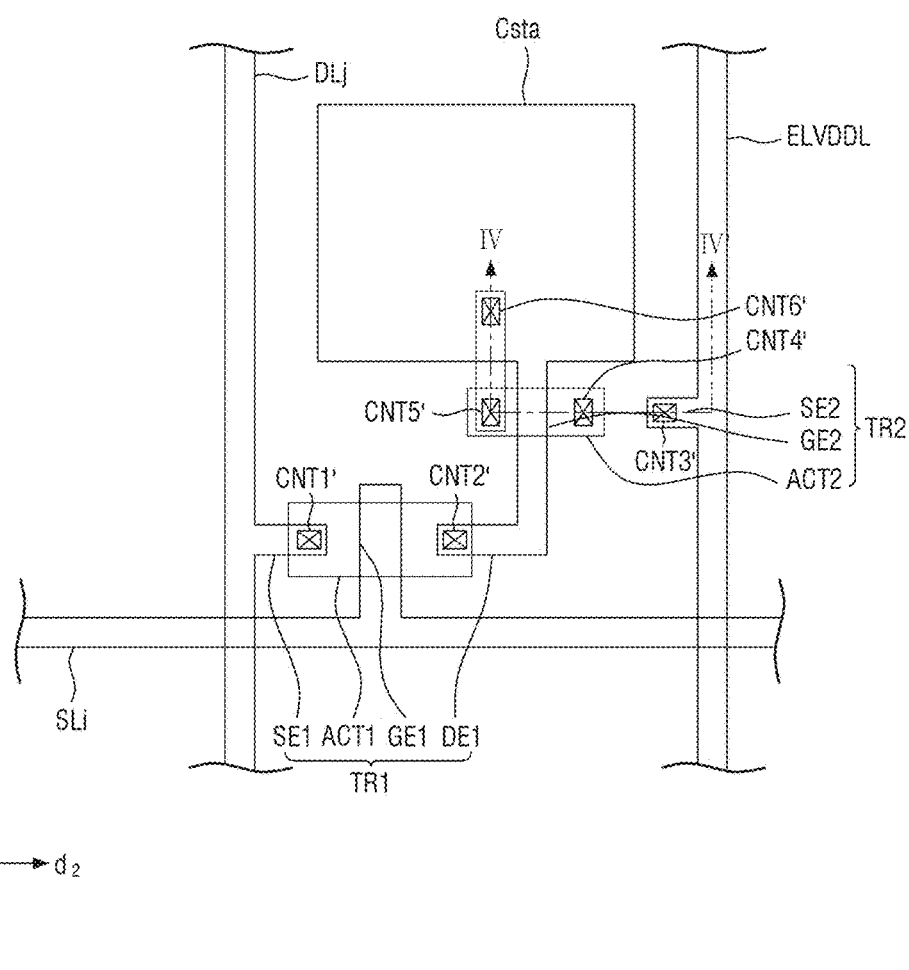
FIG. 14 is a plan view schematically showing an example of the pixel portion during the open/short test shown in FIG. 13.
Figure 15:
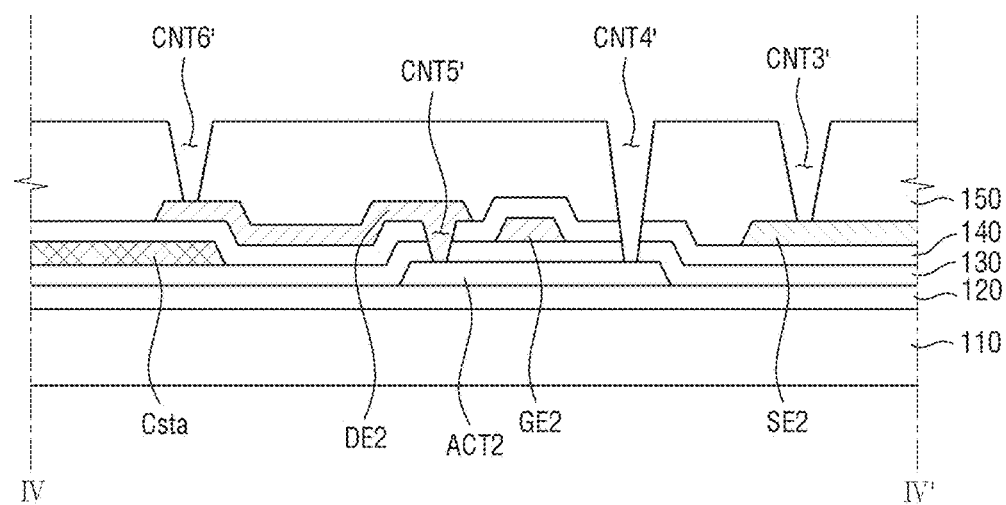
FIG. 15 is a cross-sectional view taken along line IV-IV' shown in FIG. 14.

FIG. 13 is a diagram explaining an open/short test method of the OLED device according to another exemplary embodiment of the invention. FIG. 14 is a plan view schematically showing an example of the pixel portion during the open/short test shown in FIG. 13. FIG. 15 is a cross-sectional view taken along line IV-IV' shown in FIG. 14. A redundant description similar to the description of FIGS. 1 to 10 will be omitted. In connection with FIG. 13, the driving voltage line ELVDDL and first to n-th pixel portions PX1jb to PXnjb electrically connected to the driving voltage line ELVDDL will be described as an example. In this case, the first to n-th pixel portions PX1jb to PXnjb are electrically connected to different scan lines, respectively.

Referring to FIG. 13, a third test signal ts3 is defined as a signal provided to one end (e.g., an upper end in FIG. 13) of the driving voltage line ELVDDL. In this case, one end of the driving voltage line ELVDDL is defined as a region relatively close to the first pixel portion PX1jb. A fourth test signal ts4 is defined as a signal obtained when the third test signal ts3 provided to one end of the driving voltage line ELVDDL is detected at the other end (e.g., a lower end in FIG. 13) of the driving voltage line ELVDDL via the driving voltage line ELVDDL. That is, the open/short test of the driving voltage line ELVDDL may be performed by comparing the waveform difference between the third test signal ts3 and the fourth test signal ts4.

However, referring to FIGS. 14 and 15, in the OLED device according to another exemplary embodiment of the invention, an open/short test is performed in a state where the pixel electrode PE and the second connection electrode CE2 are not provided. That is, since the pixel electrode PE and the second connection electrode CE2 are provided relatively later than the other components, the open/short test of the driving voltage line ELVDDL is performed in a state where the pixel electrode PE and the second connection electrode CE2 are not provided.

Therefore, since the display device is in a state where the driving voltage line ELVDDL and the second semiconductor pattern ACT2 are not connected to each other, an influence of the second semiconductor pattern ACT2 and other components electrically connected to the second semiconductor pattern ACT2 may be excluded during the open/short test of the driving voltage line ELVDDL.

In FIGS. 14 and 15, it is illustrated that the open/short test is performed in a state where the planarization layer 150, the third contact hole CNT3', the fourth contact hole CNT4' and the sixth contact hole CNT6' are provided, but the invention is not limited thereto. That is, when the second semiconductor pattern ACT2 and the driving voltage line ELVDDL are electrically insulated during the open/short test of the driving voltage line ELVDDL, the open/short test may be performed in a state where the planarization layer 150 is not provided.

Figure 16:
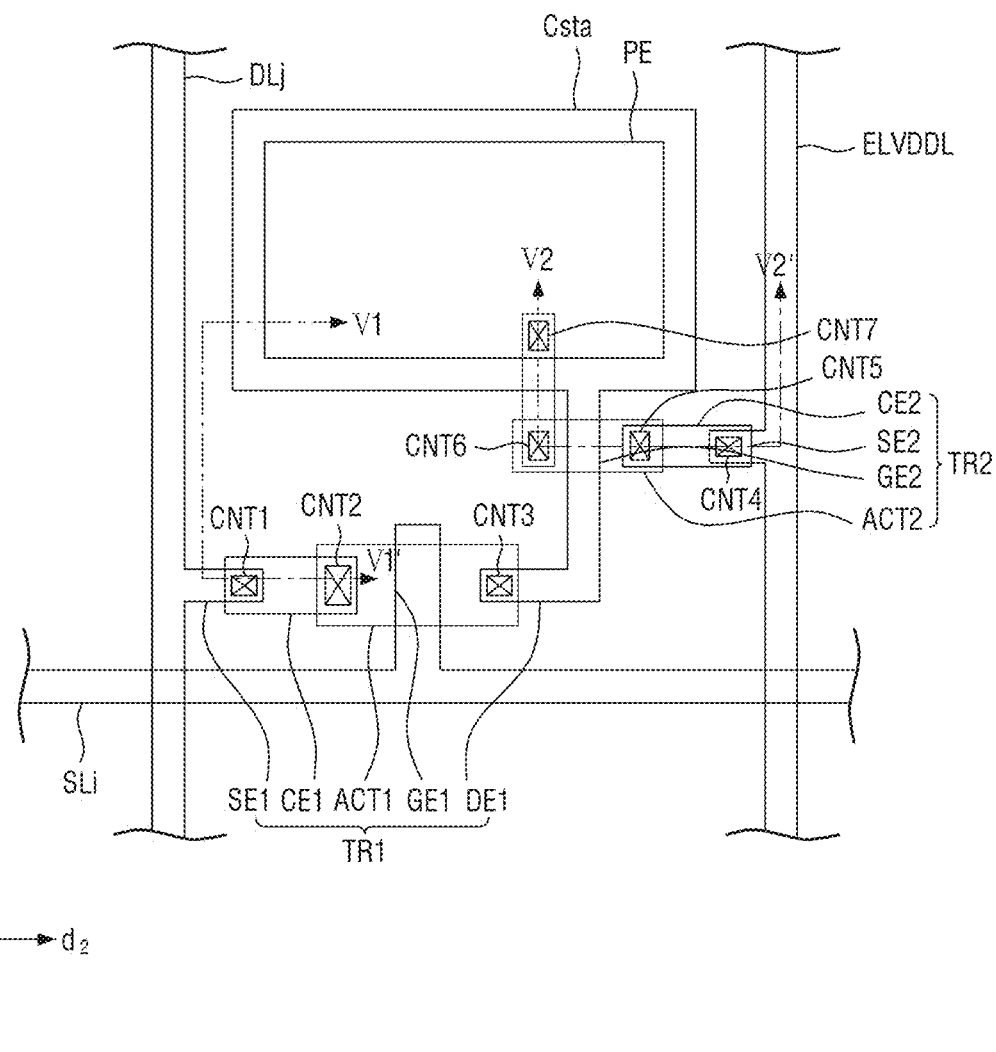
FIG. 16 is a plan view schematically illustrating another exemplary embodiment of a pixel portion of an OLED device according to the invention.
Figure 17:
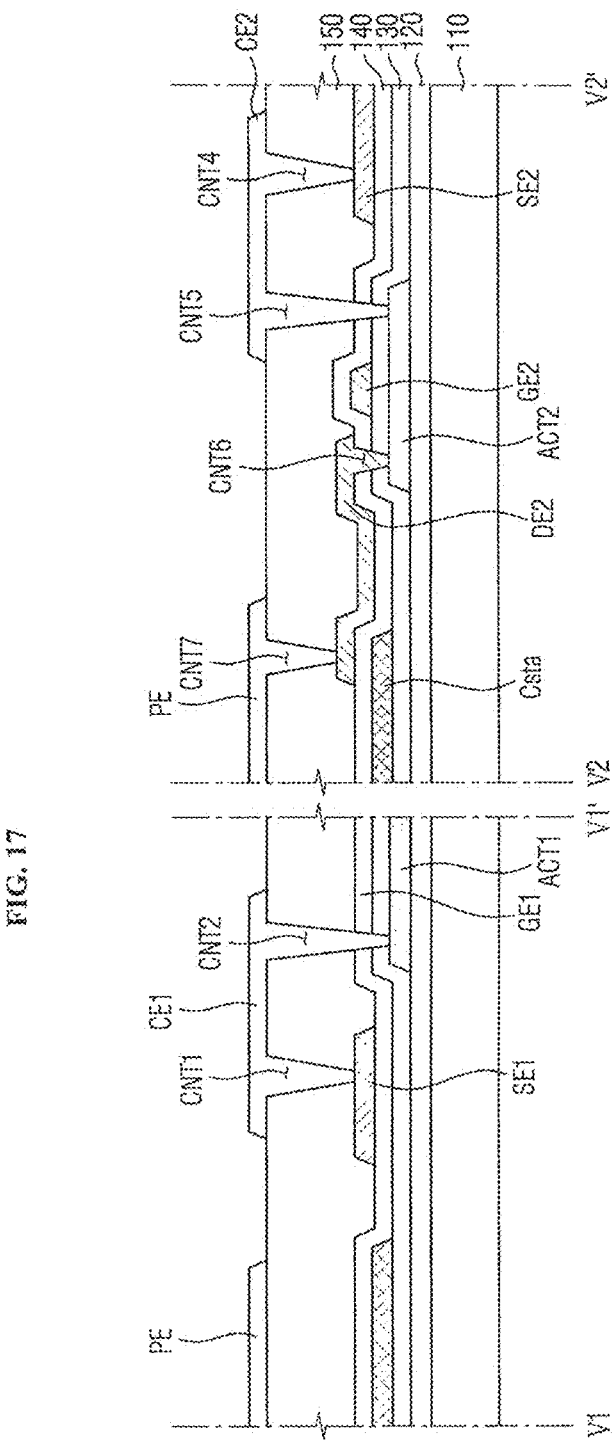
FIG. 17 is a cross-sectional view taken along line V1-V1' and line V2-V2' shown in FIG. 16.

FIG. 16 is a plan view schematically illustrating a pixel portion of an OLED device according to another exemplary embodiment of the invention. FIG. 17 is a cross-sectional view taken along line V1-V1' and line V2-V2' shown in FIG. 16. In connection with FIGS. 16 and 17, a redundant description similar to the description of FIGS. 1 to 15 will be omitted. For simplicity of description, the first to seventh contact holes are denoted by CNT1 to CNT7, and other components are designated by the same reference numerals as those used in FIGS. 1 to 10.

Referring to FIGS. 16 and 17, the OLED device according to another exemplary embodiment of the invention may include both the first connection electrode CE1 and the second connection electrode CE2.

The first connection electrode CE1 and the second connection electrode CE2 may be disposed in the same layer as the pixel electrode PE. That is, the first connection electrode CE1 and the second connection electrode CE2 may be provided by the same mask process as the pixel electrode PE.

The first source electrode SE1 of the first switching element TR1 may be electrically connected to the first semiconductor pattern ACT1 through the first connection electrode CE1. The second source electrode SE2 of the second switching element TR2 may be electrically connected to the second semiconductor pattern ACT2 through the second connection electrode CE2. Accordingly, the data signal provided to the first source electrode SE1 of the first switching element TR1 from the j-th data line DLj may be supplied to the first semiconductor pattern ACT1 through the first connection electrode CE1. Further, the first driving voltage ELVDD provided from the driving voltage line ELVDDL to the second source electrode SE2 of the second switching element TR2 may be supplied to the second semiconductor pattern ACT2 through the second connection electrode CE2.

The OLED device according to another exemplary embodiment of the invention may be configured such that an open/short test is performed in a state where the first connection electrode CE1, the second connection electrode CE2 and the pixel electrode PE are not provided. More specifically, since the display device is in a state where the first connection electrode CE1 is not provided, the j-th data line DLj and the first semiconductor pattern ACT1 are insulated from each other. Further, since the display device is in a state where the second connection electrode CE2 is not provided, the driving voltage line ELVDDL and the second semiconductor pattern ACT2 are insulated from each other.

Accordingly, in the OLED device according to another exemplary embodiment of the invention, an open/short test may be performed on at least one of the j-th data line DLj and the driving voltage line ELVDDL. As described above, since the j-th data line DLj and the first semiconductor pattern ACT1 are insulated from each other, an influence of components other than the j-th data line DLj may be excluded during the open/short test of the j-th data line DLj. Further, an influence of components other than the driving voltage line ELVDDL may be excluded during the open/short test of the driving voltage line ELVDDL.

Although the preferred exemplary embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An organic light emitting display device comprising:
a substrate;
a semiconductor pattern disposed on the substrate;
a gate electrode disposed on the semiconductor pattern;
a drain electrode disposed in a same layer as the gate electrode, and the drain electrode and the gate electrode are directly covered by a same layer;
a conductive line disposed in a different layer from the gate electrode and the drain electrode;
an insulation layer in which the conductive line and the semiconductor pattern are disposed on a first surface side of the insulation layer;
a pixel electrode disposed on a second surface side opposite the first surface side of the insulation layer; and
a connection electrode disposed on the second surface side of the insulation layer, disposed in a same layer as the pixel electrode and separated from the pixel electrode,
wherein the connection electrode is connected to the semiconductor pattern and the conductive line through the insulation layer and not connected to the pixel electrode.

2. The organic light emitting display device of claim 1, wherein the connection electrode is in direct contact with the semiconductor pattern and the conductive line.

3. The organic light emitting display device of claim 1, wherein the connection electrode and the pixel electrode include a same material.

4. The organic light emitting display device of claim 3, wherein the conductive line is disposed on the semiconductor pattern.

5. The organic light emitting display device of claim 1, further comprising a switching element including a first electrode electrically connected to the conductive line.

6. The organic light emitting display device of claim 5, wherein the conductive line includes a data line which provides a data signal to the switching element.

7. The organic light emitting display device of claim 5, wherein the conductive line includes a driving voltage line which provides a driving voltage to the switching element.

8. The organic light emitting display device of claim 5, further comprising a storage capacitor including an electrode electrically connected to a second electrode of the switching element,
wherein the electrode of the storage capacitor at least partially overlaps the pixel electrode.

9. An organic light emitting display device comprising:
a substrate;
a first semiconductor pattern disposed on the substrate;
a gate electrode disposed on the first semiconductor pattern;
a drain electrode disposed in a same layer as the gate electrode, and the drain electrode and the gate electrode are directly covered by a same layer;
a data line disposed in a different layer from the gate electrode and the drain electrode;
an insulation layer in which the data line and the semiconductor pattern are disposed on a first surface side of the insulation layer;
a pixel electrode disposed on a second surface side opposite the first surface side of the insulation layer; and
a first connection electrode in contact with the first semiconductor pattern and the data line through the insulation layer and not connected to the pixel electrode,
wherein the first connection electrode is disposed on the insulation layer, and
wherein the first connection electrode is disposed in a same layer as the pixel electrode and separated from the pixel electrode.

10. The organic light emitting display device of claim 9, wherein the first connection electrode and the pixel electrode include a same material.

11. The organic light emitting display device of claim 9, further comprising:
a first switching element including a first electrode electrically connected to the data line, the first connection electrode and the first semiconductor pattern; and
a storage capacitor including an electrode electrically connected to a second electrode of the first switching element and at least partially overlapping the pixel electrode,
wherein the second electrode of the first switching element and the electrode of the storage capacitor are disposed in a same layer.

12. The organic light emitting display device of claim 11, further comprising:
a second semiconductor pattern disposed in a same layer as the first semiconductor pattern;
a driving voltage line disposed in a same layer as the data line; and
a second connection electrode in contact with the second semiconductor pattern and the driving voltage line,
wherein the second connection electrode is disposed in the same layer as the pixel electrode.

13. The organic light emitting display device of claim 12, wherein:
the first connection electrode is in direct contact with the first semiconductor pattern and the data line, and
the second connection electrode is in direct contact with the second semiconductor pattern and the driving voltage line.

* * * * *